(12) United States Patent
Dupeyrat et al.

(10) Patent No.: US 7,060,977 B1
(45) Date of Patent: Jun. 13, 2006

(54) NANOLITHOGRAPHIC CALIBRATION METHODS

(75) Inventors: Sylvain Cruchon Dupeyrat, Chicago, IL (US); Mike Nelson, Libertyville, IL (US); Raymond K. Eby, Grayslake, IL (US)

(73) Assignee: Nanoink, Inc., Chicago, IL (US)

( * ) Notice: Subject to any disclaimer, the term of this patent is extended or adjusted under 35 U.S.C. 154(b) by 218 days.

(21) Appl. No.: 10/375,060

(22) Filed: Feb. 28, 2003

Related U.S. Application Data

(60) Provisional application No. 60/379,755, filed on May 14, 2002.

(51) Int. Cl.
*H02N 2/02* (2006.01)
*G01B 5/28* (2006.01)

(52) U.S. Cl. .................................... 250/306
(58) Field of Classification Search .................. 250/306
See application file for complete search history.

(56) References Cited

U.S. PATENT DOCUMENTS

| | | | |
|---|---|---|---|
| 5,534,359 A * | 7/1996 | Bartha et al. | 428/688 |
| 5,644,512 A * | 7/1997 | Chernoff et al. | 702/85 |
| 5,825,670 A * | 10/1998 | Chernoff et al. | 702/85 |
| 6,540,885 B1 * | 4/2003 | Keil et al. | 204/192.33 |
| 2002/0063212 A1 * | 5/2002 | Mirkin et al. | 250/306 |
| 2004/0008330 A1 * | 1/2004 | Mirkin et al. | 355/53 |

OTHER PUBLICATIONS

Cruchon-Dupeyrat et al. "Nanofabrication using computer-assisted design and automated vector-scanning probe lithography" Applied Surface Science, 175-176 (2001) 636-642.*

* cited by examiner

*Primary Examiner*—John R. Lee
*Assistant Examiner*—James J. Leybourne
(74) *Attorney, Agent, or Firm*—Foley & Lardner LLP

(57) ABSTRACT

A system and method for calibration of nanolithography includes fabricating a nanoscale test pattern, measuring a parameter of the test pattern, and calculating a calibration coefficient from the measured parameter. The calculated calibration coefficient is then used for nanolithography. Nanolithography can be carried out with nanoscopic tips depositing patterning compounds on a substrate.

78 Claims, 3 Drawing Sheets

NANOLITHOGRAPHIC CALIBRATION METHODS

RELATED APPLICATIONS

This application claims priority back to provisional application Ser. No. 60/379,755, filed May 14, 2002, for Nanolithographic Calibration Methods.

BACKGROUND

One example of nanolithographic printing is Dip—Pen Nanolithography ("DPN") printing. DPN printing is an ultrahigh-resolution direct-write lithography technique based upon the transport of chemically mobile materials (also referred to herein as "ink") from a probe (or array thereof), usually a sharp tip, to a surface of interest (i.e., the "paper") the probe contacts. For example, DPN printing allows one to draw patterns as small as one molecule high and a few dozen molecules wide.

By way of example of DPN printing methodology, octadecanethiol (ODT) is applied to an Atomic Force Microscope cantilever. When its tip is brought into contact with a gold substrate (and optionally rastered across it), the ODT molecules are transferred to and self-assemble on the gold surface, forming nanopatterns.

Current instrumentation capable of DPN printing include, for example, scanning probe microscope (SPM) technologies. Scanning probe microscopes (SPMs) scan a probe or array of probes over a sample surface and make local measurements of the properties of the sample surface. SPM can obtain detailed analyses of the topographical or other features of a surface, with sensitivities extending down to the scale of individual atoms and molecules. Several components are common to most SPMs: In addition to (a) high-precision (piezoelectric) scanners, an important component of the microscope is a tiny probe positioned in very close proximity to or in contact with a sample substrate surface and providing a measurement of its topography or some other physical parameter. The resolution is determined primarily by the shape of the tip and its proximity to the surface.

In an atomic force microscope (AFM), also called surface force microscopy, the probe generally includes a tip which projects from the end of a cantilever. Typically, the tip is very sharp to achieve maximum lateral resolution by confining the interaction to the end of the tip. By measuring motion, position or angle of the free end of the cantilever, many properties of a surface may be determined including surface topography, local adhesion, friction, elasticity, the presence of magnetic or electric fields, etc. In operation, an AFM typically will scan the tip of the probe over the sample while keeping the force of the tip on the surface constant, such as by moving either the base of the lever or the sample upward or downward to maintain deflection of the lever portion of the probe constant. Therefore, the topography of a sample may be obtained from data on such vertical motion to construct three-dimensional images of the surface topography. It is also known that AFMs can utilize analog and digital feedback circuits to vary the height of the tip of the probe or the sample based upon the deflection of the lever portion of the probe as an input. An image may be formed by scanning a sample with respect to the probe in a raster pattern, recording data at successive points in the scan, and displaying the data on a video display. The development of atomic/scanning force microscopy is described, for example, in articles by G. Binnig at al., Europhys. Lett., Vol. 3, p. 1281 (1987), and T. R. Albrecht et al., J. Vac. Sci. Technology, A6, p. 271 (1988). The development of the cantilever for AFMs is described, for example, in an article by T. R. Albrecht at al., entitled "Microfabricated Cantilever Stylus for Atomic Force Microscopy". J. Vac. Sci. Technol., A8, p. 3386 (1990).

Other types of SPMs, such as scanning capacitance or scanning magnetic force microscopes, also use similar deflection sensors. Moreover, scanning tunneling microscope (STM) is generally similar to an SFM in overall structure and purpose, except that the probe comprises a sharpened conductive needle-like tip rather than a cantilever. The surface to be mapped is conductive or semiconductive. The metallic needle is typically positioned a few Angstroms above the surface. When a bias voltage is applied between the tip and the sample, a tunneling current flows between the tip and the surface. The tunneling current is exponentially sensitive to the spacing between the tip and the surface and thus provides a representation of the spacing. The variations in the tunneling current in an STM are therefore analogous to the deflection of the cantilever in an SFM. The head contains circuitry for biasing the tip with respect to the sample and preamplifying the tunneling current before it is passed to a controller.

Further background information can be found in the following: In U.S. patent publication 2002/0063212 A1 to Mirkin et al. (published May 30, 2002); PCT publication WO 01/91855 A1; and S. Cruchon-Dupeyrat et al., *Applied Surface Science*, 175–176 (2001), 636–642.

In DPN printing, multiple parameters can affect (1) the rate of transport of the ink from the tip to the substrate; (2) its spreading on the substrate, among other factors, and hence (3) the geometric dimensions (and other characteristics) of the fabricated patterns. These parameters include the following:

Instrument control parameters, including the scan speed and the force applied by the tip, Geometric factors, including the sharpness (apex radius) of the probe tip, the roughness and grain size of the substrate, Physicochemical factors, including the type of the substrate, ink, tip and ambient medium. Examples are the chemical composition of the ink, the ink preparation and tip coating methodology, the surface chemistry of the tip and substrate, the temperature and the relative humidity (when used in air or gaseous medium).

The number of influential parameters is large; some of the parameters can be difficult or expensive to measure or to control, or they may fluctuate from run to run or during the fabrication procedure. For example, the ambient temperature and humidity are of particular importance. In order to fabricate the desired nanopatterns with the proper characteristics (e.g. size), the instrumental parameters need to be adjusted as a function of the factors that vary.

The practitioner, therefore, needs calibration procedures that will easily, if possibly automatically, determine the relationship between one or more of the parameters cited above and one or more of the (geometric) characteristics of the pattern.

SUMMARY

In one aspect, a system and method for calibration of nanolithography includes fabricating a nanoscale test pattern, measuring a parameter of the test pattern, and calculating a calibration coefficient from the measured parameter. The calculated calibration coefficient is then used for nanolithography. Nanolithography can be carried out with nanoscopic tips depositing patterning compounds on a substrate.

BRIEF DESCRIPTION OF THE DRAWINGS

The accompanying drawings, which are incorporated in and constitute a part of the specification, illustrate embodiments of the present invention and, together with the description, serve to exemplify the principles of the present invention.

DESCRIPTION

Figure 1:
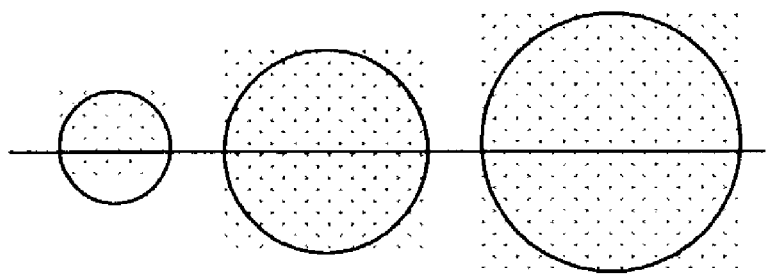
FIG. 1 shows an array of three dots patterned with increasing dwell times and a cursor positioned across all three dots.

The present invention generally relates to improving nanolithography, and in particular, DIP PEN NANOLITHOGRAPHY™ or DPN™ printing (trademarks of NanoInk, Inc., Chicago, Ill.). This improvement includes the ability to improve the accuracy of a nanolithographic process, the ability to consistently produce patterns with desired (geometric) characteristics, time after time, and the ability to minimize feature sizes obtainable through a given nanolithographic process. This improvement also improves the overall reliability and worthiness of nanolithography as a research and development tool and an industrial process. Methods are generally provided for computing calibration data for one or more calibration models. Such data and models can then be used (a) to calculate optimal instrument control parameters as a function of the desired geometries, or (b) to determine the final pattern geometry as a function of current instrument parameters, while compensating for variations in experimental conditions. A specific embodiment involving the linear calibration model for DPN is discussed in detail. Finally, the steps towards a complete automation of the calibration procedure are provided.

A calibration model can include empirically or theoretically derived sets of equations and/or algorithms, which, together with calibration data, represent or predict the output(s) of a nanolithographic process for a range of experimental conditions. For example, a calibration model for Dip Pen Nanolithography printing can predict the size of features being fabricated as a function of the instrument parameter. For example, the simplest DPN calibration model ("linear model") consists of the equation $A = c \, \Delta t$ where A is the area in which ink has been deposited in an amount of time $\Delta t$ and c is the calibration (diffusion) coefficient.

The calibration data for the calibration model can include a set of one or more coefficient(s) and/or data table(s), determined experimentally or otherwise, which, together with calibration models, represents or predicts the output(s) of a nanolithographic process for the range of experimental conditions for which it has been established. In the previous example, the calibration data would include the value of c.

The present invention generally relates to improving the control and resolution of nanolithography, and in particular, DIP PEN NANOLITHOGRAPHY™ printing or DPN™ printing (trademarks of NanoInk, Inc., Chicago, Ill.). Methods are generally provided for calibrating a plurality of instrumental parameters which affect the overall resolution of the nanolithographic patterns written on the substrate. The result is more rapid fabrication with improved control and resolution.

Nanolithographic and nanofabrication methods are known including DPN printing related methods using nanoscopic tips, patterning compounds, and substrates. In addition, these methods can be extended to a number of other nanolithography and nanofabrication techniques in which the fabrication tool can also be used for reading/imaging or in which imaging of the test pattern array is otherwise readily available in-situ. These include, but are not limited to, nanografting, nanoshaving, nano pen reader writer (NPRW), and STM based nanofabrication including bias methods.

Provisional application No. 60/379,755 filed May 14, 2002, is hereby incorporated by reference in its entirety.

U.S. patent publication 2002/0063212 A1 to Mirkin et al. (published May 30, 2002) describes calibration at paragraphs 107 to 128, Appendix at paragraphs 212–264, and FIGS. 28A and 28B in the context of direct-write nanolithographic printing methods using nanoscopic tips, which is hereby incorporated by reference in its entirety. In addition, PCT publication WO 01/91855 A1 also provides calibration on pages 26–31, FIGS. 28A and 28B, and Appendix and is hereby incorporated by reference, including the reference citations at page 61–62. However, the description is not focused on commercial production, wherein speed and automation become paramount.

Another reference is S. Cruchon-Dupeyrat et al., *Applied Surface Science*, 175–176 (2001), 636–642, which describes automated scanning probe lithography (SPL), including nanografting, and is hereby incorporated by reference. However, the description is not focused on calibration.

In addition, the following applications provide additional support and description of DPN printing of patterns and measuring pattern parameters such as, for example, line width and dot diameter:

1. U.S. Provisional application 60/115,133 filed Jan. 7, 1999 ("Dip Pen Nanolithography").

2. U.S. Provisional application 60/157,633 filed Oct. 4, 1999 ("Methods Utilizing Scanning Probe Microscope Tips and Products Therefor or Produced Thereby").

3. U.S. Regular patent application Ser. No. 09/477,997 filed Jan. 5, 2000 ("Methods Utilizing Scanning Probe Microscope Tips and Products Therefor or Produced Thereby").

4. U.S. Provisional application 60/207,713 filed May 26, 2000 ("Methods Utilizing Scanning Probe Microscope Tips and Products Therefor or Produced Thereby").

5. U.S. Provisional application 60/207,711 filed May 26, 2000 ("Methods Utilizing Scanning Probe Microscope Tips and Products Therefor or Produced Thereby").

6. U.S. Regular application Ser. No. 09/866,533 filed May 24, 2001 ("Methods Utilizing Scanning Probe Microscope Tips and Products Therefor or Produced Thereby").

7. U.S. patent publication No. 2002/0063212 A1 published May 30, 2002 ("Methods Utilizing Scanning Probe Microscope Tips and Products Therefor or Produced Thereby").

8. U.S. patent publication No. 2002/0122873 A1 published Sep. 5, 2002 ("Nanolithography Methods and Products Produced Therefor and Produced Thereby").

9. PCT publication number WO 00/41213 A1 published Jul. 13, 2000 based on PCT application no. PCT/US00/

00319 filed Jan. 7, 2000 ("Methods Utilizing Scanning Probe Microscope Tips and Products Therefor or Produced Thereby").

10. PCT publication number WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").

11. U.S. Provisional application 60/326,767 filed Oct. 2, 2001, ("Protein Arrays with Nanoscopic Features Generated by Dip-Pen Nanolithography").

12. U.S. Provisional application 60/337,598 filed Nov. 30, 2001, ("Patterning of Nucleic Acids by Dip-Pen Nanolithography").

13. U.S. Provisional application 60/341,614 filed Dec. 17, 2001, ("Patterning of Solid State Features by Dip-Pen Nanolithography").

14. U.S. Provisional application 60/367,514 filed Mar. 27, 2002, ("Method and Apparatus for Aligning Patterns on a Substrate").

15. U.S. Provisional application 60/379,755 filed May 14, 2002, ("Nanolithographic Calibration Methods").

16. U.S. Regular application Ser. No. 60/326,767 filed Oct. 2, 2002, ("Protein And Peptide Nanoarrays").

17. U.S. Regular application Ser. No. 10/366,717, filed Feb. 14, 2003 ("Method and Apparatus for Aligning Patterns on a Substrate").

In particular, for example, in prior application Ser. No. 09/866,533, filed May 24, 2001, direct-write nanolithographic printing background and procedures are described in detail covering a wide variety of embodiments including, for example: background (pages 1–3); summary (pages 3–4); brief description of drawings (pages 4–10); use of scanning probe microscope tips (pages 10–12); substrates (pages 12–13); patterning compounds (pages 13–17); practicing methods including, for example, coating tips (pages 18–20); instrumentation including nanoplotters (pages 20–24); use of multiple layers and related printing and lithographic methods (pages 24–26); resolution (pages 26–27); arrays and combinatorial arrays (pages 27–30); software and calibration (pages 30–35; 68–70); kits and other articles including tips coated with hydrophobic compounds (pages 35–37); working examples (pages 38–67); corresponding claims and abstract (pages 71–82); and FIGS. 1–28.

All of the above text, including each of the various subsections enumerated above including the figures, is hereby incorporated by reference in its entirety and form part of the present disclosure, supporting the claims.

Provisional patent application 60/382,596 filed May 21, 2002 to Mirkin et al. is hereby incorporated by reference, particularly for its disclosure concerning the deposition of proteins and peptides with use of DPN printing.

Other guidance on carrying out DPN printing procedures include US patent publication 2002 0122873 A1, published Sep. 5, 2002 to Mirkin et al., which is hereby incorporated by reference. This application includes, for example, use of tips which have external openings and internal cavities, and use of electrical, mechanical, and chemical driving forces. One method includes aperture pen nanolithography.

Finally, SPMs are described in, for example, U.S. Pat. Nos. 5,025,658 and 5,224,376, the entire disclosures of which are incorporated herein by reference. DPN methodology is described in, for example, International Patent Application No. PCT/US00/00319, and the article "Dip-Pen Nanolithography" by Pinen, Zhu, Xu, Hong, and Mirkin (*Science*, vol. 283, Jan. 29, 1999), the entire disclosures of which (including defined terms contained therein) are incorporated herein by reference.

A desirable nanolithographic procedure is capable of proceeding (1) rapidly, in an automated or semi-automated way rather than manually; and (2) in-situ, meaning capable of calibration using the conditions of the day, just before or during fabrication.

Consistent with the present invention, a method provides for rapid, in-situ and automated methods to correct for the variable parameters affecting resolution of the nanolithographic process, including the DPN printing process, and provides for conducting nanolithography with use of calibration.

Consistent with the present invention, a method for conducting nanolithography or nanofabrication includes using calibration. The nanolithography and nanofabrication may be implemented with DPN printing. The calibration may be performed with software, hardware or some combination thereof. In general, the calibration process may include (i) fabricating a test pattern, (ii) measuring a parameter of the test pattern, (iii) calculating a calibration coefficient from the parameter measurement, and (iv) using the calibration coefficient for nanofabrication or nanolithography. The calibration coefficient may be a diffusion coefficient.

In one aspect of the present invention, the calibration process determines the diffusion coefficient c, or area patterned per unit of time, assuming a linear model $A=c\Delta t$ for DPN nanolithography, where A is the area where ink is deposited in amount of time $\Delta t$. In other words, the diffusion coefficient relates the "linewidth" (defined as the width of a line drawn by a single scan of the tip) and the scanning speed, or the area of the dot fabricated by diffusion of ink from an immobile tip and the "dwell time" (contact time). This model is useful for inks forming self-assembled monolayers, such as thiols and silanes and the usual laboratory experimental conditions. This method can be used in DPN printing and the unique parameters and environmental factors that affect the performance of DPN printing. Furthermore, this method can utilize DPN printing to draw the patterns that are subsequently measured to establish the calibration for the system. It is to be understood that the foregoing general description and the following detailed description are exemplary and explanatory only and are not to be viewed as being restrictive of the invention, as claimed.

Figure 2:
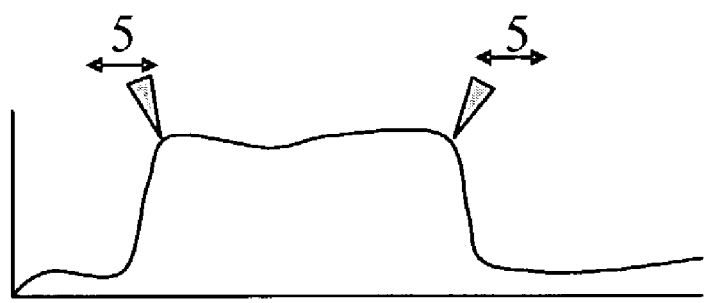
FIG. 2 shows a plot of the cross section through one of the dots in FIG. 1 along with cursors positioned at the edge of the dot.
Figure 3:
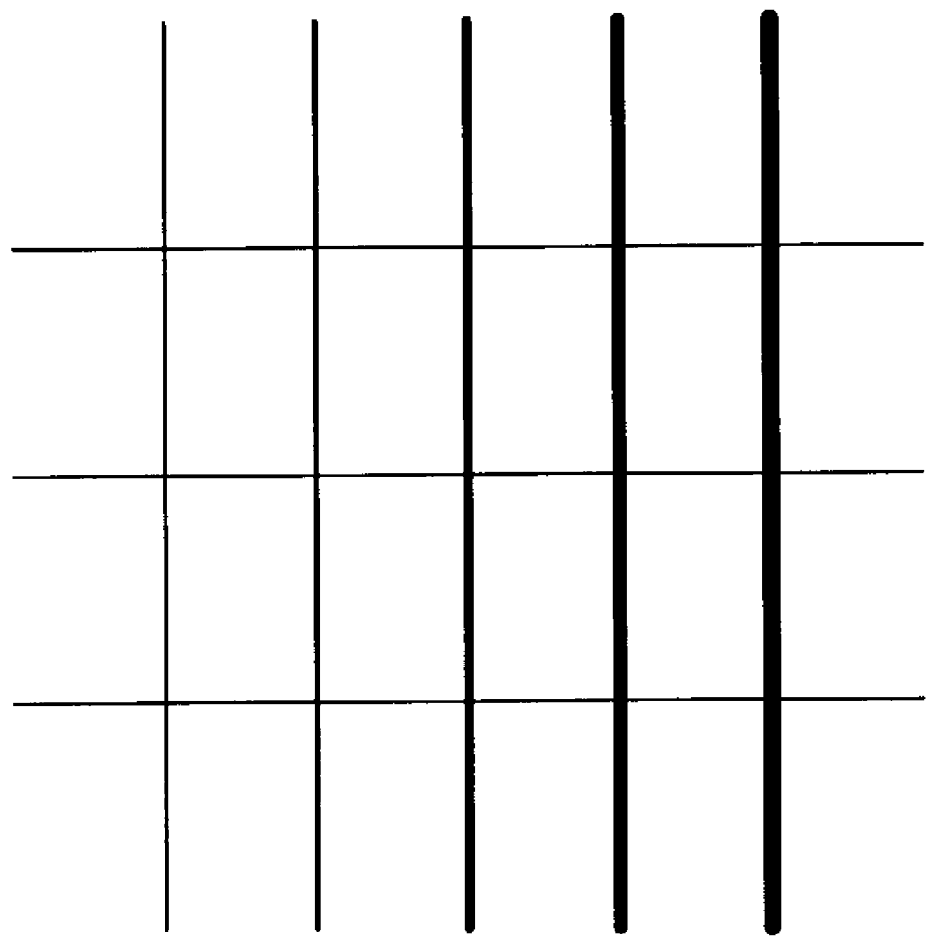
FIG. 3 shows an array of five lines patterned with decreasing write speed.
Figure 4:
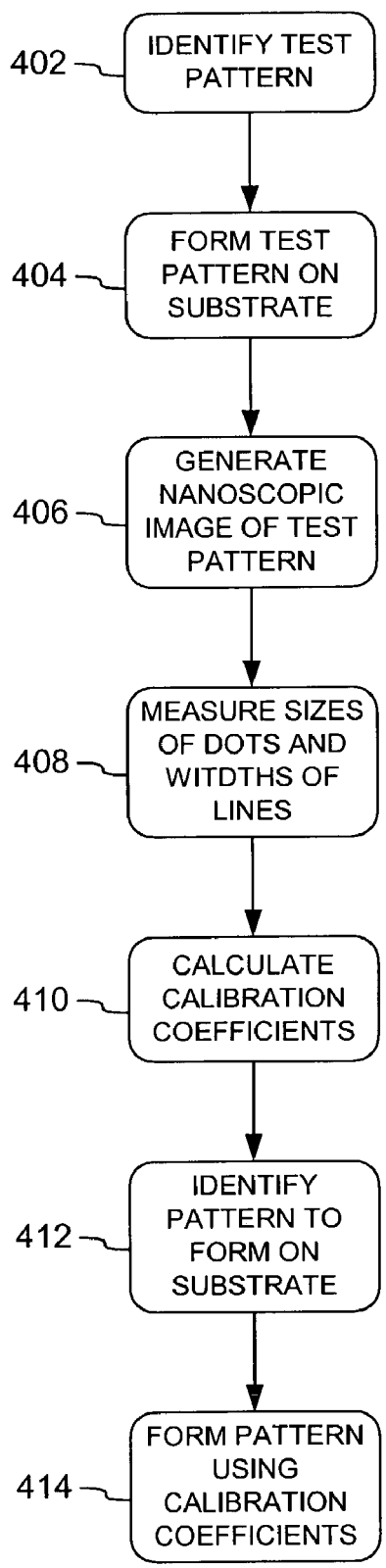
FIG. 4 is a flow diagram of a calibration process consistent with the present invention.

FIG. 4 is a flow diagram of a calibration process consistent with the present invention. As shown in FIG. 4, a test pattern to be formed on a substrate is identified (step 402). In one aspect of the present invention, calibration software can provide for writing multiple (e.g., two) different patterns using DPN printing as depicted in FIGS. 1, 2, and 3. The first pattern can consist of dots patterned at different dwell times (FIG. 1), and the second pattern can consist of lines drawn at different speeds (FIG. 3). In general, increasing the dwell time increases the size of the dot, and decreasing the speed in which the lines are drawn increases the width of the lines. Diameters of the dots and lines can be less than about 5 microns, or more particularly, less than about 1 micron, or more particularly, less than about 100 nm, and more particularly, less than about 50 nm, and more particularly, less than about 20 nm. Diameters of the dots and lines can about 1 nm or more, and more particularly, about 5 nm or more, and more particularly, about 10 nm or more. The lower limit on diameter generally is governed by the size of the probe tip. Smaller probe tips allow for smaller diameters. Hence, angstrom level probe tips can result in angstrom level diameters such as 3–10 angstroms. Although dots and lines are preferred shapes, other shapes can be used if desired.

The test pattern may include at least one dot, and may include at least three dots. The test pattern may also include at least one line, and may include at least five lines. More preferably, the test pattern may include at least one dot and at least one line. The test pattern may include two different test patterns.

Once the test pattern is identified, it is formed on the substrate (step 404). The test pattern formed on the substrate, as described above, can include one or more dots and/or one or more lines. Each dot is preferably formed with a different dwell time, and each line is preferably formed with a different drawing speed, resulting in dots of various sizes and diameters and lines with various widths.

After writing the test pattern or patterns, a nanoscopic image of the test pattern is generated (step 406). To generate the nanoscopic image, an AFM can be used in a lateral force microscopy mode to image the pattern. Other nanosopic imaging processes are also possible. If the resulting image is adequate, then the sizes of the dots and the widths of the lines are measured (step 408). To measure the dot sizes and line widths, a user can use cursors (or lines) that intersect the center of the circles and cross at a right angle to the lines. In each case, cross sectional plots can be displayed which allow the user to position cursors that will measure the size of the dots and line cross sections. In another aspect of the invention, the diameter of the dots can be measured by centering a circular graphic within the image of the dot and interactively changing the size of the circular graphic until it exactly covers the original dot. Optionally, automated image analysis and pattern recognition methods could be used to dynamically measure the diameter of the dots and line widths.

Calibration coefficients are then calculated (step 410). The calibration coefficients, which preferably correspond to diffusion coefficients for drawing dots and lines, can be calculated from the cross sectional measurements along with the parameters used to draw the original DPN patterns to calculate the calibration coefficients, which are subsequently used to perform nanofabrication. An empirical correlation for determining the coefficients can be derived between process parameters, such as between dwell time and dot area or diameter and between line speed and linewidth to derive the coefficients. Linear regression methods or other statistical averaging methods can be used to derive the diffusion coefficients for dots and lines based on the measurements and the corresponding dwell times and line speeds.

Once the calibration coefficients have been calculated, it is possible to form accurate patterns on the substrate. First, a pattern to be formed on the substrate is identified (step 412). The pattern can be identified from among a plurality of different patterns. The patterns can include one or more dots and one or more lines. The identified pattern is then formed using the calculated calibration coefficients (step 414). Using the calculated coefficients, the operation of a DPN printer can be adjusted to provide dots and lines and other images with desired sizes and widths.

The calibration coefficients are preferably used to control nanolithography. The use is preferably done shortly after the calculation of the coefficients such as for example, within an hour or within a day. Nanolithographic methods, controlled by the calibration methods disclosed herein, can be carried out using equipment and consultations available from NanoInk, Inc. (Chicago, Ill.).

The calibration software can be packaged together with other software useful for conducting nanolithography, including DPN printing.

It will be appreciated that various aspects of the invention can be further improved or enhanced, for example, through the following means:

One could implement a number of improvements to further automate the process including automated image analysis methods to make measurements of the initial DPN patterns. These automated methods could also improve the accuracy and repeatability of the measurements.

Image enhancement algorithms could be used to improve the quality of the initial DPN patterns and further improve accuracy and repeatability.

One could draw several sets of initial DPN patterns while varying one or more of the parameters that affect the resolution and then establish a set of calibration coefficients to be manually or automatically applied.

Corrections for tip convolution effects could be applied to further improve the accuracy of the results.

The calibration pattern can be automatically placed on the surface in areas not occupied by other patterns.

The calibration process can be implemented to be interoperable with other computer-assisted design programs such as, for example, InkCAD, available from NanoInk Inc. (Chicago, Ill.);

The calibration routines can be called automatically by quality control software, such as when a quality threshold has been crossed.

The process can be extrapolated to DPN with multiple cantilevers or cantilever arrays. For example, DPN can be carried out with 32 cantilevers (or pens). In this case, the calibration procedure may be applied to each cantilever simultaneously or sequentially. The resulting arrays of DPN patterns could be imaged with the same tips or with specialized reading tips or other devices.

In addition, one skilled in the art can obtain and/or develop computer control hardware and software, including selection of computer language and source code, to implement the calibration methods described herein. State-of-the-art methods are preferred including, for example, Microsoft's .NET software. Computer networking is possible for implementing the invention. Digital computation and high speed electronics can be used.

The calibration can be carried out with automated image analysis and/or with image enhancement algorithms. In addition, the calibration can be carried out with corrections being applied for tip convolution effects. The calibration can also be an automated calibration, a semi-automated calibration or a non-automated calibration. The calibration can also be an in-situ calibration. The calibration preferably improves the resolution of the nanolithography.

The nanolithography can also be carried out with use of an atomic force microscope, a scanning tunneling microscope, or a near field scanning optical microscope.

In one aspect of the present invention, a method for improving the resolution of dip pen nanolithography comprises writing at least one test pattern, imaging the test pattern, measuring the cross-sectional size of the test pattern, calculating a calibration parameter from the measurement, and conducting dip pen nanolithography with use of the calibration parameter.

In another aspect of the present invention, a method of nanolithograpy comprises providing a substrate, providing a scanning probe microscope tip, coating the tip with a patterning compound, and contacting the coated tip with the substrate so that the compound is applied to the substrate so as to produce a desired pattern, wherein the contacting is carried out with calibration to improve the pattern resolution.

A substrate can be patterned by any of the above methods.

In a further aspect of the present invention, a kit for nanolithography comprises a substrate, a scanning probe microscope tip, and a computer or a computer-readable medium configured for calibration. The computer can be configured for calibration of nanolithographic methods, dip pen nanolithographic printing methods, and nanofabrication methods.

In another aspect of the present invention, an automated calibration method comprises fabricating arrays of DPN test patterns with varying fabrication parameters, measuring one or more characteristics of the test parameters in situ, calculating appropriate calibration coefficients, and subsequently using the calibration coefficient to perform nanofabrication. Software can be configured to measure the area or linewidth of test patterns drawn at different scanning speeds or dwelling times, and calculating a diffusion coefficient after imaging and interactive measurement of the characteristic of the test feature. Automated image analysis methods may be used to make measurements of initial DPN test patterns. In addition, image enhancement algorithms may be used to improve the quality of the initial DPN test patterns to further improve the accuracy and repeatability of the resulting measurements. Corrections for tip convolution effects may be applied to further improve the accuracy of the results.

This automated calibration method can be applied to DPN printing systems with multiple cantilevers or cantilever arrays. The method as described above can also be used to identify critical experimental parameters and design DPN printing instrumentation accordingly. In addition, the method as described above used as an optimization method iterating through several calibrations experiments until optimum conditions, estimated by the resolution or presence of defects, are reached.

It will be understood that the calibration process has other DPN printing related applications in addition to pre-fabrication calibration including, for example:

For the purpose of fundamental research and instrument design, to identify critical experimental parameters, and design the DPN printing instrumentation accordingly.

As a mapping method, to explore multidimensional experimental surfaces (plot of a quality measurement versus one or more experimental parameters). Quality measurements can be quantitative (linewidth, resolution, waviness of the pattern edges) or qualitative (presence of unwanted defects, estimated through user input or automated image processing and recognition methods). To study the effects of more than one parameter, one needs to draw 2D arrays or arrays of 2D arrays of patterns (for more than two parameters).

As an optimization method. Experimental design techniques (matrix or multiplex) may be used to design and iterate through several calibration experiments until optimum conditions (again, estimated by the resolution, the presence of defects) are reached.

As a quality control or factory calibration method, for example during the final stage of the fabrication of tip arrays, As a process control method, during DPN printing production (1) to verify the proper functioning of the DPN instrument; (2) to dynamically adapt the DPN process to known or unknown parameter variation. In the later case, it can query from or control other parts of the instrument and/or external instrumentation.

The calibration process as described above can further be used as a process control method during DPN printing production to verify the proper functioning of the DPN instrument. Also, the process as described above can be used to dynamically adapt the DPN process to known or unknown parameter variation. The process as described above can be used as a quality control or factory calibration method during fabrication of tip arrays.

In addition to the calibration processes described above, it is possible to use more than one process or select which process to use, as well as include calibration processes that take into account non-linear effects that impact the calibration data including the calibration coefficients. For example, a user can select from models including: using the linear model described above; using a user-entered default speed and dwell time; or using models based upon simple engineering curves such as linear by pieces, nth-degree polynomial equations, or sigmoidal curves.

The models can be modified to provide the ability to obtain more test dots and/or lines, linking the process to a more sophisticated pattern generator like dots and lines, or a "dots and line"-like interface with arraying capabilities capable of creating the test array of dots and/or lines. Other modifications include the ability to automatically extract quantitative information, such as dot diameters and line widths, from images of the test pattern, preferably by image processing. Another modification is the ability to select an appropriate model from a list of possible calibration processes.

Yet another modification includes the ability to manually fit the model equation to the data, such as by adjusting equation parameters while overlaying the result curve with experimental data points. It is also possible to have automated curve-fitting, such as using the least squares Levenberg-Marquardt method), which could be used to obtain refined values for the equation parameters.

A user can be provided with canned models from existing published literature. Parameters of such models, such as surface tension of the inks, Fickian diffusion coefficients, etc., can be entered in an option form or could be imported from an "ink information database" shared with software functionalities such as "automated inking" and "layer properties." Alternatively, the user can be provided with the ability to code its own speed/dwell time calculation routines. Different formulas can be used. For example, the formula can be implemented with an Excel formula-like interface, where the user enters equations in a set of textboxes, one for each calculation routine (speed/dwell time/linewidth/dot diameter). Alternatively, the formula can be implemented with a Visual Studio-like interface, where the user is provided with a more complete user interface, in essence a program editor. The user writes full-fledged visual basic routines in a scripting language like Visual Basic or Jscript, which the user then compiles as a plug-in for InkCAD. InkCAD then calls the plug-in whenever it requires a dwell time/speed calculation.

In this case, there are numerous possibilities. For example, the user can call external programs, link the calculation to external resources (e.g. chemical information databases), display its own UI, etc. For example, it would be possible, with the development of environmental chamber control software, to provide the user with, for example, the current temperature and humidity. The instrument could therefore automatically adjust for variations of experimental conditions.

Those skilled in the art will recognize, or be able to ascertain using no more than routine experimentation, many equivalents to the specific embodiments of the invention specifically described herein. Such equivalents are intended to be encompassed in the scope of the present invention.

What is claimed is:

1. A method for calibration of a scanning probe nanolithographic process, the method comprising:
   (i) fabricating a nanoscale test pattern by scanning probe lithography,
   (ii) measuring a parameter of the test pattern,
   (iii) calculating a calibration coefficient from the measured parameter,
   (iv) using the calculated calibration coefficient for forming a nanolithographic pattern by scanning probe lithography.

2. The method according to claim 1, wherein the calibration coefficient is a diffusion coefficient.

3. The method according to claim 1, wherein the test pattern comprises at least one dot.

4. The method according to claim 1, wherein the test pattern comprises dots patterned at different dwell times.

5. The method according to claim 4, wherein measuring a parameter includes measuring sizes of each of the dots of the test pattern.

6. The method according to claim 5, wherein the calculating includes calculating the calibration coefficient from the different dwell times and the measured sizes of each of the dots.

7. The method according to claim 5, wherein the calculating includes using one of a linear regression method and a statistical averaging method to calculate the calibration coefficient from the different dwell times and the measured sizes of each of the dots.

8. The method according to claim 1, wherein the test pattern comprises at least one line.

9. The method according to claim 1, wherein the test pattern comprises lines drawn at different drawing speeds.

10. The method according to claim 9, wherein measuring a parameter includes measuring widths of each of the lines of the test pattern.

11. The method according to claim 10, wherein the calibration coefficient is calculated from the different drawing speeds and the measured widths of each of the lines.

12. The method according to claim 10, wherein the calculating includes using one of a linear regression method and a statistical averaging method to calculate the calibration coefficient from the different drawing speeds and the measured widths of each of the lines.

13. The method according to claim 1, wherein the test pattern is fabricated by deposition of a patterning compound from a scanning probe microscopic tip to a substrate.

14. The method according to claim 13, wherein the scanning probe microscopic tip is an atomic force microscopic tip.

15. The method according to claim 1, wherein a plurality of scanning probe microscopic tips is used for fabrication of the test pattern, and the calibration process is carried out with each of the plurality of tips.

16. The method according to claim 1, wherein automated image analysis is used to measure the parameter of the test pattern.

17. The method according to claim 1, wherein a pattern recognition method is used to measure the parameter of the test pattern.

18. The method according to claim 1, wherein an image enhancement algorithm is used to measure the parameter of the test pattern.

19. The method according to claim 1, wherein multiple test patterns are fabricated.

20. The method according to claim 1, further comprising application of tip convolution effects.

21. The method according to claim 1, wherein the test pattern is automatically fabricated in an area different than the area where nanolithography is later carried out.

22. The method according to claim 1, wherein the method steps are carried out as part of a computer-assisted program in interoperation with at least one computer-assisted design program.

23. The method according to claim 1, wherein the calibration process is part of a calibration routine, and the calibration routine is automatically called by quality control software when a quality threshold has been crossed.

24. The method according to claim 1, wherein the test pattern is fabricated by deposition of a patterning compound from an atomic force microscopic tip to a substrate, wherein the calibration coefficient is a diffusion coefficient, and wherein the test pattern comprises dots patterned at different dwell times and lines drawn at different speeds.

25. The method according to claim 24, wherein the nanolithography is carried out on the same substrate subject to deposition of the patterning compound.

26. The method according to claim 25, wherein the nanolithography is carried out on the same day as the fabrication of the test pattern.

27. The method according to claim 1, wherein the type of nanolithography used in the nanolithography step is the same as the type of nanolithography used to fabricate the test pattern.

28. Use of the method in claim 1 to identify critical experimental parameters for fabrication of the test pattern which affect the parameter of the test pattern.

29. Use of the method in claim 1 for quality control in nanolithography factory production.

30. Use of the method in claim 1 for optimization in nanolithography factory production.

31. A method according to claim 1, further comprising forming a nanoscopic image of the test pattern.

32. A method according to claim 31, wherein the test pattern includes at least two dots patterned with different dwell times and at least two lines drawn patterned with different drawing speeds.

33. A method according to claim 32, wherein the measuring includes measuring the size of the dots and the widths of the lines from the nanoscopic image of the test pattern.

34. A method according to claim 33, wherein the calculating includes calculating calibration coefficients based on the measured sizes of the dots, the measured widths of the lines, the dwell times and the drawing speeds.

35. A method of nanolithography comprising:
   a) providing a substrate and a scanning probe microscopic tip;
   b) coating the tip with a patterning compound; and
   c) using the coated tip to apply the compound to the substrate so as to produce a desired pattern,
   wherein the application is carried out using automated calibration to control pattern size, and wherein the automated calibration comprises fabricating a nanoscopic test pattern on the substrate, measuring a parameter of the test pattern, and calculating a calibration coefficient from the measured parameter.

36. The method according to claim 35, wherein the automated calibration comprising fabricating, measuring, and calculating is carried out on the same day as the application of the compound.

37. A method of nanolithography comprising:
a) providing a substrate and a nanoscopic tip;
b) applying a patterning compound from the tip to the substrate so as to produce a desired pattern,
wherein the application is carried out using automated calibration to control pattern size, and wherein the automated calibration comprises fabricating a nanoscopic test pattern on the substrate, measuring a parameter of the test pattern, and calculating a calibration coefficient from the measured parameter.

38. The method according to claim 37, wherein the automated calibration comprising fabricating, measuring, and calculating is carried out on the same day as the application of the compound.

39. A computer-readable medium operable on a computer system for calibration of scanning probe nanolithography, the computer-readable medium configured to:
(i) fabricate a nanoscopic test pattern by scanning probe lithography,
(ii) measure a parameter of the test pattern,
(iii) calculate a calibration coefficient from the measured parameter,
(iv) use the calculated calibration coefficient for forming a nanolithographic pattern by scanning probe lithography.

40. The computer-readable medium according to claim 39, wherein the calibration coefficient is a diffusion coefficient.

41. The computer-readable medium according to claim 39, wherein the test pattern comprises at least one dot.

42. The computer-readable medium according to claim 39, wherein the test pattern comprises dots patterned at different dwell times.

43. The computer-readable medium according to claim 42, further configured to measure sizes of each of the dots of the test pattern.

44. The computer-readable medium according to claim 43, further configured to calculate the calibration coefficient from the different dwell times and the measured sizes of each of the dots.

45. The computer-readable medium according to claim 44, further configured to use one of a linear regression method and a statistical averaging method to calculate the calibration coefficient from the different dwell times and the measured sizes of each of the dots.

46. The computer-readable medium according to claim 39, wherein the test pattern comprises at least one line.

47. The computer-readable medium according to claim 39, wherein the test pattern comprises lines drawn at different speeds.

48. The computer-readable medium according to claim 47, further configured to measure widths of each of the lines of the test pattern.

49. The computer-readable medium according to claim 48, further configured to calculate the calibration coefficient from the different drawing speeds and the measured widths of each of the lines.

50. The computer-readable medium according to claim 48, further configured to use one of a linear regression method and a statistical averaging method to calculate the calibration coefficient from the different drawing speeds and the measured widths of each of the lines.

51. The computer-readable medium according to claim 39, wherein the test pattern is fabricated by deposition of a patterning compound from a scanning probe microscopic tip to a substrate.

52. The computer-readable medium according to claim 51, wherein the scanning probe microscopic tip is an atomic force microscopic tip.

53. The computer-readable medium according to claim 39, wherein a plurality of scanning probe microscopic tips is used for fabrication of the test pattern, and the calibration process is carried out with each of the plurality of tips.

54. The computer-readable medium according to claim 39, wherein the calculation of the calibration coefficient is carried out with use of statistical averaging methods.

55. The computer-readable medium according to claim 39, wherein automated image analysis is used to measure the parameter of the test pattern.

56. The computer-readable medium according to claim 39, wherein a pattern recognition method is used to measure the parameter of the test pattern.

57. The computer-readable medium according to claim 39, wherein an image enhancement algorithm is used to measure the parameter of the test pattern.

58. The computer-readable medium according to claim 39, wherein multiple test patterns are fabricated.

59. The computer-readable medium according to claim 39, further comprising application of tip convolution effects.

60. The computer-readable medium according to claim 39, wherein the test pattern is automatically fabricated in an area different than the area where nanolithography is later carried out.

61. The computer-readable medium according to claim 39, wherein the steps are carried out as part of a computer-assisted program in interoperation with at least one computer-assisted design program.

62. The computer-readable medium according to claim 39, wherein the calibration process is part of a calibration routine, and the calibration routine is automatically called by quality control software when a quality threshold has been crossed.

63. The computer-readable medium according to claim 39, wherein the test pattern is fabricated by deposition of a patterning compound from an atomic force microscopic tip to a substrate, wherein the calibration coefficient is a diffusion coefficient, wherein the test pattern comprises dots patterned at different dwell times or lines drawn at different speeds.

64. The computer-readable medium according to claim 63, wherein the nanolithography is carried out on the same substrate also subject to deposition of the patterning compound.

65. The computer-readable medium according to claim 64, wherein the nanolithography is carried out on the same day as the fabrication of the test pattern.

66. The computer-readable medium according to claim 39, wherein the type of nanolithography used in the nanolithography step is also used to fabricate the test pattern.

67. An SPM system for calibrated scanning probe nanolithography, comprising:
a processor configured to control the operation of an SPM tip; and
a memory, coupled to the processor, the memory comprising a plurality of instructions executed by the processor, the plurality of instructions configured to:
(i) fabricate a nanoscopic test pattern by scanning probe lithography, (ii) measure a parameter of the test pattern, (iii) calculate a calibration coefficient from the measured parameter, and (iv) use the calculated calibration coefficient for forming a nanolithographic pattern by scanning probe lithography.

68. A method for calibration of a scanning probe nanolithographic manufacturing process using a computer program, the method comprising:

(i) fabricating a test pattern by scanning probe lithography, (ii) measuring a parameter of the test pattern, (iii) calculating a calibration coefficient from the measured parameter, (iv) using the calculated calibration coefficient for forming a nanolithographic pattern by scanning probe lithography, wherein the fabricating, measuring, calculating, and using steps are automatically executed from the same computer program in a manufacturing process.

69. Method according to claim 68, wherein the nanolithographic pattern is formed with use of scanning probe microscopic tips and patterning compound.

70. Method according to claim 68, wherein the nanolithographic pattern is formed within one hour of fabricating the test pattern.

71. Method according to claim 68, wherein method is automated method.

72. Method according to claim 68, wherein method is semi-automated.

73. The method according to claim 1, wherein the nanolithographic process is a direct-write nanolithographic process, and the nanolithographic pattern is formed with use of direct-write nanolithography.

74. The medium according to claim 39, wherein the nanolithographic is a direct-write nanolithography, and the nanolithographic pattern is formed with use of direct-write nanolithography.

75. The SPM system according to claim 67, wherein the calibrated nanolithography is a direct-write nanolithography, and the nanolithographic pattern is formed with use of direct-write nanolithography.

76. The method according to claim 1, wherein multiple calibration coefficients are calculated.

77. The method according to claim 1, further comprising the step of selecting a calibration model from a list of calibration models.

78. A method for calibration of a scanning probe nanolithographic process, the method comprising:

(i) fabricating a nanoscale test pattern by scanning probe lithography, (ii) measuring a parameter of the test pattern, (iii) obtaining a data table from the measured parameter, (iv) using the data table for forming a nanolithographic pattern by scanning probe lithography.

* * * * *